United States Patent [19]

Asaumi et al.

[11] Patent Number: 4,804,612
[45] Date of Patent: Feb. 14, 1989

[54] HIGHLY HEAT-RESISTANT POSITIVE-WORKING O-QUINONE DIAZIDE CONTAINING PHOTORESIST COMPOSITION WITH NOVOLAC RESIN MADE FROM PHENOL WITH ETHYLENIC UNSATURATION

[75] Inventors: Shingo Asaumi, Fujisawa; Hidekatsu Kohara, Chigasaki; Hatsuyuki Tanaka, Samakawa; Toshimasa Nakayama, Hiratsuka, all of Japan

[73] Assignee: Tokyo Ohka Kogyo Co., Ltd., Kanagawa, Japan

[21] Appl. No.: 62,954

[22] Filed: Jun. 16, 1987

[30] Foreign Application Priority Data

Jul. 18, 1986 [JP] Japan ................................ 61-167896

[51] Int. Cl.$^4$ ..................... G03C 1/60; G03C 1/495
[52] U.S. Cl. .................................... 430/192; 430/193; 430/323; 430/326; 430/313; 430/328
[58] Field of Search ................................ 430/192, 193

[56] References Cited

U.S. PATENT DOCUMENTS

| | | | |
|---|---|---|---|
| 4,289,838 | 9/1981 | Rowe et al. | 430/192 |
| 4,299,911 | 11/1981 | Ochi et al. | 430/192 |
| 4,435,496 | 3/1984 | Walls et al. | 430/288 |
| 4,439,291 | 3/1984 | Irving et al. | 430/287 |
| 4,477,553 | 10/1984 | Yamamoto et al. | 430/192 |
| 4,529,682 | 7/1985 | Toukhy | 430/165 |

FOREIGN PATENT DOCUMENTS 239283 9/1986 German Democratic Rep. ..................................... 430/192

OTHER PUBLICATIONS

Pampalone, T. R., *Solid State Technology*, pp. 115–120, 6/1984.

Primary Examiner—Charles L. Bowers, Jr.
Attorney, Agent, or Firm—Wyatt, Gerber, Burke and Badie

[57] ABSTRACT

Although the positive-working photoresist composition comprises a phenolic novolac resin as the film-forming component and a known photosensitizing compound as in conventional compositions, the novolac resin is prepared from a specific mixture of two classes of phenolic compounds including, one, phenol, cresols and/or resorcinol and, the other, one or more of the phenolic compounds having a nucleus-substituting group selected from allyloxy, allyloxymethyl, allyl dimethyl silyl, 2-(allyl dimethyl silyl) ethoxy, cinnamoyl, acryloyl and methacryloyl groups. By virtue of this unique combination to give the phenolic moiety in the novolac resin, the photoresist composition has markedly improved heat resistance as well as stability against plasma in dry etching so that the composition can give a patterned photoresist layer with extreme fineness having high fidelity to the mask pattern.

9 Claims, No Drawings

HIGHLY HEAT-RESISTANT POSITIVE-WORKING O-QUINONE DIAZIDE CONTAINING PHOTORESIST COMPOSITION WITH NOVOLAC RESIN MADE FROM PHENOL WITH ETHYLENIC UNSATURATION

BACKGROUND OF THE INVENTION

The present invention relates to a highly heat-resistant positive-working photoresist composition or, more particularly, to a positive-working photoresist composition having high heat resistance as well as resistance against the conditions of dry etching with stability of the pattern configuration of the resist layer, which is useful in the manufacture of various semiconductor devices and electronic components involving a step of photolithography.

As a trend in the electronic technology in recent years, semiconductor devices and electronic components are required to be manufactured in a more and more increased density of integration or compactness in size. Along with this general trend, the patterning works to form a fine resist pattern by the techniques of photolithography are also required to have increased fineness reaching the so-called submicron order which can be achieved only by a great improvement in the photoresist composition used in the process. As is known, photoresist compositions can be classified into negative and positive-working ones depending on the behavior of solubility changes induced by exposure to light. While it was the major current of the photolithography in the semiconductor industry in the early days that the photoresist composition was of the negative-working type, the current is now under shift toward replacement of the negative-working photoresist compositions with positive-working ones since the photoresist compositions of the latter type are more promising than the former in the possibility of giving a patterned resist layer of extremely high resolving power having a fineness of, for example, 1 to 2 μm or even finer in the width of line patterns.

To briefly describe the photolithographic process by using a positive-working photoresist composition in the manufacture of semiconductor devices, the substrate such as a semiconductor silicon wafer is first coated with the photoresist composition in the form of a solution followed by drying to form a uniform layer of the photoresist composition which is then exposed pattern-wise to actinic rays such as ultraviolet light to give a latent image of the photoresist layer. The latent image of the photoresist layer is developed to give a patterned photoresist layer by use of a developer solution which dissolves away the photoresist composition only on the areas where the photoresist layer has been selectively exposed to actinic rays. The thus obtained pattern-wise photoresist layer on the substrate is usually subjected to a heat treatment to improve the heat resistance prior to the subsequent process of etching.

This process of etching is also on the trend of shift from the conventional wet-process etching to the dry-process etching such as plasma etching and reactive ion etching to meet the increasing requirements in recent years for the extreme fineness of patterning to reliably reproduce a very fine line pattern and for the automatization of the process. In this regard, high heat resistance is one of the essential characteristics of a positive-working photoresist composition used in the fine patterning works.

The conventional positive-working photoresist compositions of the major class in the prior art are usually formulated with a phenol novolac resin as a film-forming component which is admixed with or combined by an addition reaction with a photosensitizing component such as quinone diazide compounds. The photoresist compositions of this type are not quite satisfactory to meet the practical requirements in respect of the insufficient heat resistance due to the relatively low softening point of the component resin which limits the temperature of the heat treatment of the patterned resist layer prior to etching rarely to exceed 100° to 110° C.

The heat resistance of a patterned layer of a positive-working photoresist composition after development can be improved alternatively by the irradiation with ultraviolet which is effective to form crosslinks between the molecules of the film-forming resin even when the resin is the above mentioned phenol novolac since the crosslinked resin has an increased softening point to withstand the heat treatment at a higher temperature than the resin before the photo-induced crosslink formation. Even by the combination of the ultraviolet irradiation and heat treatment, however, the patterned layer of the conventional photoresist compositions cannot be imparted with high heat resistance to withstand the conditions of dry etching process and fully comply with the recent requirements of fine patterning with little deformation of the patterned resist layer. Accordingly, it is eagerly desired to develop a novel positive-working photoresist composition having inherently improved resistance against heat and the conditions of dry etching.

SUMMARY OF THE INVENTION

The present invention therefore has an object to provide an improved positive-working photoresist composition having remarkably increased heat resistance to withstand the conditions of dry etching and capable of giving a patterned resist layer with little deformation even in an extremely fine line pattern as being freed from the above described problems and disadvantages in the prior art compositions.

Thus, the highly heat-resistant positive-working photoresist composition of the present invention comprises:
(A) 100 parts by weight of a phenolic novolac resin containing the phenolic moiety derived from two classes of phenolic compounds comprising
  (a) at least one of the first phenolic compounds selected from the class consisting of phenol, cresols and resorcinol, and
  (b) at least one of the second phenolic compounds having, as a nucleus-substituting group in a molecule, an ethylenically unsaturated group selected from the class consisting of allyloxy, allyloxymethyl, allyl dimethyl silyl, 2-(allyl dimethyl silyl)ethoxy, cinnamoyl, acryloyl and methacryloyl groups; and
(B) from 20 to 60 parts by weight of an ester of naphthoquinone diazide sulfonic acid.

DETAILED DESCRIPTION OF THE PREFERRED EMBODIMENTS

As is understood from the above described summary of the invention, the most characteristic feature of the inventive highly heat-resistant positive-working photoresist composition consists in the use of a specific phenolic novolac resin as the film-forming component. Namely, the phenolic novolac resin as the component (A) should comprise the phenolic moiety derived from two kinds of the phenolic compounds, of which the first should be one or a combination of phenol, cresols i.e., o-cresol, m-cresol or p-cresol and resorcinol and the second should be one or a combination of the phenolic compounds having, as a nucleus-substituting group in a molecule, an ethylenically unsaturated group selected from the class consisting of allyloxy, allyloxymethyl, allyl dimethyl silyl, 2-(allyl dimethyl silyl)ethoxy, cinnamoyl, acryloyl and methacryloyl groups.

The phenolic compounds of the second class include: 2-, 3- and 4-hydroxyphenyl allyl ethers; 2-, 3- and 4-hydroxybenzyl allyl ethers; 2-, 3- and 4-(allyl dimethyl silyl) phenols; 2-, 3- and 4-[2-(allyl dimethyl silyl)ethoxy]phenols; 2-, 3- and 4-cinnamoyl phenols; 2-, 3and 4-acryloyl phenols; 2-, 3- and 4-methacryloyl phenols; and the like.

The phenolic novolac resin as the component (A) is a co-condensation product of the two types of the phenolic compounds with formaldehyde. Namely, the novolac resin can be prepared according to a known procedure of the condensation reaction from a mixture of the first and the second phenolic compounds which is admixed with formalin and oxalic acid as a condensation catalyst. The mixture of the phenolic compounds should be composed of at least 50% by weight or, preferably, from 60 to 90% by weight of the first phenolic compound or compounds and 50% or less or, preferably, from 40 to 10% by weight of the second phenolic compound or compounds.

The component (B) in the inventive photoresist composition is a photosensitizing compound which is preferably an ester of naphthoquinone diazidosulfonic acid. Such a compound can readily be obtained, for example, as a reaction product of the esterification reaction in a conventional manner between naphthoquinone diazidosulfonic acid or a reactive derivative thereof and a compound having one or more of phenolic hydroxy groups, such as polyhydroxy benzophenones, e.g., tetrahydroxy benzophenones, alkyl gallates and the like. Suitable phenolic compounds include, in addition to the above mentioned polyhydroxy benzophenones and alkyl gallates, trihydroxybenzenes, trihydroxybenzene monoethers, 2,2',4,4'-tetrahydroxy diphenyl methane, 4,4'-dihydroxy diphenyl propane, 4,4'-dihydroxy diphenyl sulfone, di(2-hydroxynaphthyl) methane, 2-hydroxy fluorene, 2-hydroxy phenanthrene, polyhydroxy anthraquinones, purpurogallin and derivatives thereof, phenyl 2,4,6-trihydroxy benzoate and the like.

The positive-working photoresist composition of the invention should comprise from 20 to 60 parts by weight or, preferably, from 20 to 40 parts by weight of the above defined photosensitizing compound as the component (B) per 100 parts by weight of the phenolic novolac resin as the component (A). When the amount of the photosensitizing compound is too small, the photoresist layer after development may be subject to undue decrease in the film thickness on the areas unexposed to actinic rays. When the amount thereof is too large, on the other hand, the photosensitivity of the comosition would be disadvantageously decreased.

The inventive photoresist composition should preferably be used in the form of a solution prepared by dissolving the above described components (A) and (B) in an organic solvent. Exemplary of the organic solvent suitable for the purpose are ketones such as acetone, methyl ethyl ketone, cyclohexanone and isoamyl ketone, polyhydric alcohols and derivatives thereof such as ethyleneglycol, ethyleneglycol monoalkyl ethers and acetates thereof, ethyleneglycol monoacetate, monomethyl ethers, monoethyl ethers, monopropyl ethers, monobutyl ethers and monophenyl ethers of diethyleneglycol or monoacetate thereof, and the like, cyclic ethers such as dioxane, esters such as methyl acetate, ethyl acetate and butyl acetate, and derivatives of propyleneglycol such as methyl, ethyl and butyl ethers of propyleneglycol and propyleneglycol monoacetate. These organic solvents can be used either singly or as a mixture of two kinds or more according to need.

The inventive positive-working photoresist composition may be admixed optionally with various kinds of known additives having compatibility with the essential ingredients and conventionally used in photoresist compositions such as auxiliary resins, plasticizers, stabilizers, coloring agents to serve for further increasing the visibility of the patterned image after development, and so on.

The procedure for forming a patterned photoresist layer using the inventive photoresist composition may be any of conventional ones. For example, the surface of a substrate body such as a semiconductor silicon wafer is coated with the inventive photoresist composition in the form of an organic solution by use of a suitable coating machine such as spinners followed by drying to form a uniform photoresist layer thereon, which is then exposed pattern-wise to light on a minifying projector or a suitable apparatus for exposure through a photomask bearing a desired pattern followed by development using a developer solution which is usually an aqueous solution of an organic base such as tetramethyl ammonium hydroxide and choline in a concentration of 2 to 5% by weight so that the photoresist layer is selectively dissolved away on the areas where the photoresist composition has been imparted with increased solubility in the developer solution as a result of exposure to light to give a high-fidelity minified reproduction of the pattern on the photomask. It is preferable that the patterned resist layer formed in this manner is subsequently subjected to whole-surface exposure first to ultraviolet light having a wavelength of 350 to 450 nm and then to far-ultraviolet light having a wavelength of 200 to 300 nm so as to further improve the resistance of the photoresist layer to withstand heating and conditions of dry etching without affecting the fidelity of the pattern to the mask pattern and without causing deformation of the cross sectional form of the pattern.

As is described above in detail, the positive-working photoresist composition of the invention has high resistance against heat and plasma atmosphere for dry etching by virtue of the use of a very specific phenolic novolac resin as the film-forming component to give a high-fidelity pattern reproduction of the mask pattern with utmost fineness. In particular, the softening point of the patterned photoresist layer after development can be greatly improved by the two-step whole-surface exposure to the ultraviolet light of different wavelength regions so that the subsequent heat treatment can be performed at a much higher temperature than otherwise. Therefore, the stability of the patterned resist layer can be improved so much in the subsequent treatment of dry etching to give an extremely fine high-fidelity pattern reproduction with only very small deformation of the resist pattern so that the inventive photoresist composition is useful in the manufacturing process of various kinds of semiconductor devices and electronic components.

In the following, the positive-working photoresist composition of the invention is described in more detail by way of Examples and Comparative Example.

EXAMPLE 1

A phenolic novolac resin was prepared in a conventional procedure using oxalic acid as the condensation catalyst from a 60:40 by weight mixture of m-cresol and 4-hydroxyphenyl allyl ether with admixture of formalin. This novolac resin was used as the film-forming component of a photoresist composition which was prepared by dissolving 100 parts by weight of the resin and 30 parts by weight of a 2,3,4-trihydroxy benzophenone ester of naphthoquinone-1,2-diazide-5-sulfonic acid in 390 parts by weight of ethyleneglycol monoethyl ether acetate followed by filtration of the solution through a membrane filter of 0.2 $\mu$m pore diameter.

A semicondctor silicon wafer of 4 inches diameter was uniformly coated with the thus prepared photoresist composition in a thickness of 3.0 $\mu$m as dried by using a spinner (Model TR-4000, manufactured by Tazmo Co.) followed by drying at 110° C. for 90 seconds on a hot plate to form a uniform photoresist layer. The photoresist layer was then exposed patternwise to ultraviolet on an apparatus for minifying projection exposure (Wafer Stepper Model DSW-4800, manufactured by GCA Co.) through a test chart mask (manufactured by Dai-nippon Printing Co.) and developed at 23° C. for 30 seconds with a 2.38% by weight aqueous solution of tetramethyl ammonium hydroxide as the developer solution to dissolve away the photoresist layer on the exposed areas. The minimum exposure time was 880 milliseconds by which a line pattern having a line width of 1.0 $\mu$m could be developed with full resolution.

The patterned photoresist layer on the substrate surface was then subjected to two-step whole-surface exposure first with the ultraviolet light emitted from a high-pressure mercury lamp of 500 watts output for 10 seconds and then with far-ultraviolet light emitted from a low-pressure mercury lamp of 100 watts output to give a dose of 9.6 J/cm$^2$ with an energy density of 8 mW/cmz at a wavelength of 254 nm. The patterned photoresist layer after the two-step whole-surface exposure was stable without softening even by a heat treatment at 250° C. for 30 minutes exhibiting absolutely no deformation of the pattern. The substrate provided with the patterned photoresist layer on the surface was subject to a treatment of dry etching with the photoresist as a mask to find no deformation of the pattern despite the temperature elevation up to 200° C. in the plasma chamber during the treatment.

EXAMPLES 2 to 7

The experimental procedure in each of these Examples was substantially the same as in Example 1 except that the mixture of the phenolic compounds used in the preparation of the novolac resin was composed of the combination of two phenolic compounds shown below and the ester of naphthoquinone diazide sulfonic acid used as the photosensitizing compound was one of those indicated below as I to VI, the amount of which in the composition was as shown in Table 1 in parts by weight per 100 parts by weight of the novolac resin. Table 1 shows the minimum exposure time in milliseconds required for complete reproduction of a line pattern of 1.0 $\mu$m line width in each Example. The cross sectional form of the line pattern was unchanged after a heat treatment at 250° C. for 30 minutes in each Example. Further, the patterned resist layer in each Example could withstand the attack of the plasma in the treatment of dry etching.

Formulation of the phenolic mixture for the novolac resin

Example 2: 60:40 by weight mixture of m-cresol and 4-(allyl dimethyl silyl) phenol Example 3: 80:20 by weight mixture of phenol and 4-cinnamoyl phenol Example 4: 80:20 by weight mixture of resorcinol and 4-[2-(allyl dimethyl silyl) ethoxy]phenol Example 5: 70:30 by weight mixture of m-cresol and 2-hydroxybenzyl allyl ether Example 6: 70:30 by weight mixture of m-cresol and 2-acryloyl phenol Example 7: 70:30 by weight mixture of m-cresol and 2-methacryloyl phenol

Photosensitizing compound

I: an esterification product of 1 mole of 2,3,4trihydroxy benzophenone and 1.6 moles of naphthoquinone-1,2-diazide-5-sulfonyl chloride II: an esterification product of 1 mole of 2,4,6trihydroxy benzophenone and 1.8 moles of naphthoquinone-1,2-diazide-5-sulfonyl chloride III: an esterification product of 1 mole of 2,3,4trihydroxy benzophenone and 2.0 moles of naphthoquinone-1,2-diazide-5-sulfonyl chloride IV: an esterification product of 1 mole of 2,3,4-trihydroxy-4'-hydroxy benzophenone and 2.2 moles of naphthoquinone-1,2-diazide-5-sulfonyl chloride V: an esterification product of 1 mole of 1,2,3trihydroxy benzene and 1.6 moles of naphtho- quinone-1,2-diazide-5-sulfonyl chloride VI: an esterification product of 1 mole of phenyl 2,4,6-trihydroxy benzoate and 1.6 moles of naphthoquinone-1,2-diazide5-sulfonyl chloride

TABLE 1

| Example No. | 2 | 3 | 4 | 5 | 6 | 7 |
|---|---|---|---|---|---|---|
| Photosensitizing compound | I | II | III | IV | V | VI |
| (parts by weight) | (30) | (25) | (25) | (25) | (25) | (30) |
| Minimum exposure time, ms | 960 | 800 | 1100 | 1200 | 1200 | 860 |

Comparative Example.

The experimental procedure was substantially the same as in Example 1 except that the novolac resin was prepared from m-cresol alone conventionally used in the preparation of cresol novolac resins as the phenolic starting material of the resin. The patterned photoresist layer could not withstand a heat treatment at 200° C. for 20 minutes with noticeable deformation of the pattern.

What is claimed is:

1. A positive-working photoresist composition which comprises:
    (A) 100 parts by weight of a phenol novolac resin which is a co-condensation product of formaldehyde and a reaction mixture of two phenolic compounds comprising:
        (a) at least 50% by weight of a first phenolic compound selected from the group consisting of phenol, o-cresol, m-cresol, p-cresol and resorcinol, and (b) up to 50% by weight of a second phenolic compound which is a phenol substituted with an ethylenically unsaturated substitutent selected from the group consisting of allyloxy, allyloxymethyl, allyl dimethyl silyl, 2-(allyl dimethyl silyl) ethoxy cinnamoyl, acryloyl and methacryloyl groups; and (B) as the photosensitive compound, from 20 to 60 parts by weight of an ester of naphthoquinone diazide sulfonic acid.

2. A photoresist composition of claim 1 wherein the first phenolic compound is m-cresol and the second phenolic compound is 4-hydroxyphenyl allyl ether.

3. A photoresist composition of claim 1 wherein the first phenolic compound is m-cresol and the second phenolic compound is 4-(allyl dimethyl silyl)phenol.

4. A photoresist composition of claim 1 wherein the first phenolic compound is phenol and the second phenolic compound is 4-cinnamoyl phenol.

5. A photoresist composition of claim 1 wherein the first phenolic compound is resorcinol and the second phenolic compound is 4-phenol.

6. A photoresist composition of claim 1 wherein the first phenolic compound is m-cresol and the second phenolic compound is 2-hydrosybenzyl allyl ether.

7. A photoresist composition of claim 1 wherein the first phenolic compound is m-cresol and the second phenolic compound is 2-acryloyl phenol.

8. A photoresist composition of claim 1 wherein the first phenolic compound is m-cresol and the second phenolic compound is 2-methacroyl phenol.

9. The photoresist composition of claims 1, 2, 3, 4, 5, 6, 7 or 8 wherein the reaction mixture from which the novolac resin is prepared contains 60 to 90% by weight of the first phenolic compound and 40 to 10% by weight of the second phenolic compound.

* * * * *